United States Patent [19]

Fiedler

[11] Patent Number: 5,275,326
[45] Date of Patent: Jan. 4, 1994

[54] GUIDE HOLE SLEEVES FOR BOAT TRANSPORTS SUPPORTING SEMICONDUCTOR DEVICE ASSEMBLIES

[75] Inventor: Wallace A. Fiedler, San Jose, Calif.

[73] Assignee: LSI Logic Corporation, Milpitas, Calif.

[21] Appl. No.: 933,429

[22] Filed: Aug. 21, 1992

[51] Int. Cl.⁵ .................................. B23K 37/04
[52] U.S. Cl. .......................... 228/47.1; 228/39; 269/900; 118/406
[58] Field of Search ............ 228/254, 259, 37, 39, 228/40, 47; 269/900, 903; 118/406, 423, 428; 427/282; 432/253

[56] References Cited

U.S. PATENT DOCUMENTS

| | | | |
|---|---|---|---|
| 2,964,007 | 12/1960 | Buffington | 228/39 |
| 3,088,191 | 5/1963 | Breiling | 228/39 |
| 4,421,265 | 12/1983 | Boyer et al. | 228/39 |
| 5,130,164 | 7/1992 | Hutchison | 228/254 |

*Primary Examiner*—Samuel M. Heinrich
*Attorney, Agent, or Firm*—Gerald E. Linden; Michael D. Rostoker

[57] ABSTRACT

Damage to the pins and ceramic body of pin grid array type semiconductor device assemblies is avoided by providing ceramic bushings in the pin-receiving holes of a boat transport. The bushings elevate the package body above the platform surface of the boat, and also alleviate problems associated with unequal thermal expansion of the metal boat and the ceramic package. In an alternate embodiment, a ceramic insert formed as a square ring encompassing an area roughly equivalent to the area of the package body is provided with holes for receiving the pins, and the boat transport has a cavity for receiving and retaining the ceramic insert.

12 Claims, 3 Drawing Sheets

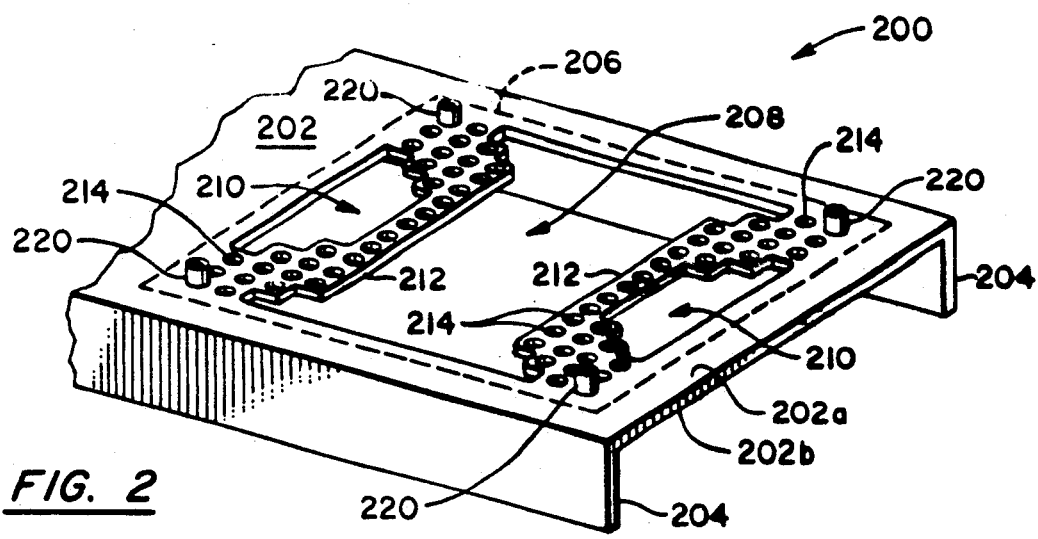
FIG. 2
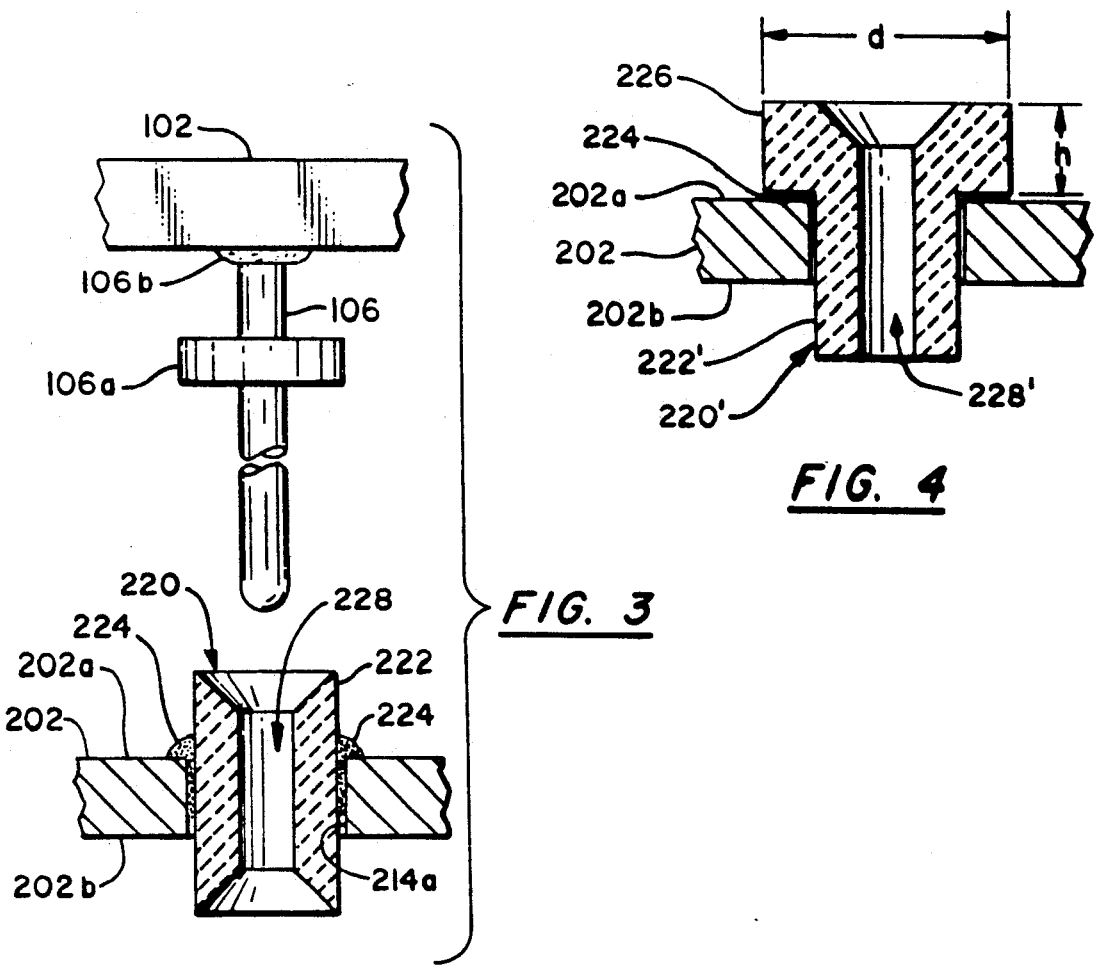
FIG. 3
FIG. 4

GUIDE HOLE SLEEVES FOR BOAT TRANSPORTS SUPPORTING SEMICONDUCTOR DEVICE ASSEMBLIES

TECHNICAL FIELD OF THE INVENTION

The invention relates to the assembly of semiconductor devices in a package, and particularly to steps in package assembly where the semiconductor device is sealed within a ceramic body having pins.

BACKGROUND OF THE INVENTION

As used herein, a "semiconductor device" is a silicon chip (die) containing circuit elements on a face thereof, and a "semiconductor device assembly" is a silicon chip contained within a package and connected (wired or bonded) to conductive leads which exit the package.

A common type of semiconductor device assembly has a plurality of pins exiting the bottom surface of the package body, and is termed a Pin Grid Array (PGA). The present invention is especially applicable to PGAs.

The complexity of modern semiconductor devices results in a high number of pins. Pin counts in excess of one hundred are not uncommon. For high pin count packages, the pins are necessarily very thin and closely spaced. Spacing on the order of 0.070-0.100 inch (center-to-center) is not uncommon. Evidently, these pins are delicate, and caution must be exercised in handling the package to avoid damaging the pins so that they can be properly aligned with corresponding holes in a printed wiring board (e.g.) or in a socket to which the packaged device is ultimately mounted. Common damage modes include: 1) physical distortion of the leads, or 2) removal of plating from the leads due to scraping (the leads are commonly gold-plated). Damage to the ceramic package body itself by the metallic boat is also a concern.

In the process of packaging a semiconductor device, it is typical that the semiconductor die is inserted into an opening in the package. The package already has pins exiting the package body, and lead fingers within the package body. The lead fingers ar bonded (or wired) to the pins. After the semiconductor device is connected to the lead fingers (such as by wire or tape-automated bonding), a lid is applied over the package opening to seal the device within the package. During these packaging steps, there are many opportunities for causing damage to the pins while handling and processing the package.

FIG. 1 shows a typical semiconductor device assembly 100, for which the present invention is especially pertinent. The assembly includes a square, flat ceramic package body 102 having a top surface 102a and a bottom surface 102b. An opening 104 extends into the top surface of the package. A plurality of pins 106 extend outward from the bottom surface 102b, and are connected 10 (not shown) to lead fingers (die bond sites) 108 which extend to within the opening. This type of package is referred to as a Pin Grid Array (PGA).

A semiconductor die 114 is inserted into the opening 104, is attached to a die attach pad (not shown), and is connected to the exposed ends (bonding sites) of the lead fingers 108 by any suitable technique (e.g., wire bonding or tape automated bonding).

In many cases, selected pins, for example one pin at each of the four corners of the package 102, are provided with expanded "stops" 106a spaced from the bottom 102b of the package body 102, so that the package body 102 will sit a prescribed distance above a printed wiring board to which the assembly 100 is mounted. For purposes of this discussion, pins 106 having stops 106a are termed "guide pins".

It should also be noted that a central area (not shown) on the bottom surface 102b of the package 102 may or may not be free of pins, in an area corresponding roughly to the opening 104. (In the case that an array of pins covers the entire bottom surface 102, the package is referred to as a "fully-populated" pin grid array. In the case that a central area is free of pins, the package is a "partially populated" array.)

The top surface 102a of the package is has a metallic ring 110 formed about the periphery of the opening 104. After the semiconductor device 114 is attached to the lead fingers 108, a lid 116 is secured over the opening 104, "capping" the package. The lid is essentially a flat metal (or ceramic) plate, and is evidently slightly larger than the opening 104. The lid is commonly sized to fit over the ring 110. A solder "preform" foil 118, of similar size and shape as the ring 110 is provided between the lid 116 and the ring 110, so that the lid may be secured to the package body 102 simply by heating the entire assembly, causing the preform 118 to seal and secure the lid 116 to the top surface of the package 102, over the opening 104.

As mentioned above, in the process of mounting the die in the package, and capping the package, the entire assembly is typically passed through an oven (i.e., to melt the preform 118, inter alia). Conveyor transports are common, and the packages may be placed on "boats" for the journey through the oven.

FIG. 1 shows a portion of boat 150, positioned to receive the semiconductor device assembly 100. The boat 150 is typically an elongated metal structure capable of supporting and transporting a number (e.g., six) of semiconductor device assemblies 100. The boat 150 is a rigid metal structure having a platform portion 120, a top surface 120a, a bottom surface 120b and an area designated by dashed line 122 for supporting the semiconductor device assembly 100. The boat is provided with side portions 124 extending downward from opposite side edges of the platform portion 120, so that the top surface 120a is maintained a suitable distance above a conveyor belt (not shown).

A number of holes 126 are provided through the platform portion 120, and the holes 126 are sized and spaced to allow the pins 106 to pass easily through the top surface 120a so that the package body 102 rests directly on the platform 120.

Typically, the holes 126 are quite (about 0.020 inches) larger than the diameter of the pins 106, to allow easy insertion of the pins and to prevent gouging or scraping of the pin plating. This evidently allows the package 102 to move, and allows the pins to contact the platform 120. Some of the holes 126 may be only a slightly (e.g., 0.005 inches) larger than the pins 106, and these particular holes "126a" act as guide holes, for accurately positioning the package.

Evidently, the holes 126 are capable of gouging the typically softer plating material on the pins 106, due to burrs and the like. This problem is exacerbated by the smaller guide holes 126a. Further, there are expansion problems when the assembly 100 is transported through an oven on the boat 150, in that the plate portion 120 can contact the pins 106.

In cases where stops 106a are not provided, the package body 102 rests directly atop the platform portion, which can cause damage to brazing 106b (see FIG. 3) at the junction of the pin 106 and the package body 102.

Further, the boat is typically formed of a material (e.g., stainless steel) galvanically dissimilar from the pin material (e.g., gold-plated copper) which, when the assembly is transported through an oven can cause undesirable corrosion, electrolysis, or the like, of the pins 106.

As shown in FIG. 1, a large cutout 130 extends through the plate portion 120 in a region essentially central to the area 122. This cutout 130 allows automated machinery (not shown) to lift the finished semiconductor device assembly 100 up off of the boat 150 both during and at the completion of fabrication (packaging). The package is generally lifted once per operation (e.g., die attach, wire bonding, etc.).

As shown in FIG. 1, additional cutouts 132 may be provided within the periphery of the area 122, to minimize the number of holes 126. Only relatively few holes 126, compared with the total number of leads 106, are needed.

Taking into account the cutout 130 and additional cutouts 132, the plate portion 120 is left with "bridges" 134 at two opposite sides of the area 122, and the bridges have a sufficient number of holes 126 to properly align and maintain reasonably motionless a semiconductor device assembly 100.

In the process of inserting the leads 106 of the assembly 100 into the holes 126, because the boat is the direct support for the semiconductor device assembly, contact between the leads and the boat occurs. During the installation and removal of the package from the boat, physical bending of the pins may occur because of the close tolerances necessary to maintain package alignment. At the points of contact, motion of the semiconductor device assembly on the boat has been observed to cause the pin plating to be worn or scratched away, exposing either the under coat or the base metal.

What is needed is a boat assembly that does not damage pins or package bodies.

DISCLOSURE OF THE INVENTION

It is an object of the present invention to provide an improved technique for handling semiconductor device assemblies during steps involving placing the package on a boat transport.

It is another object of the present invention to provide a technique for preventing motion of a semiconductor device assembly relative to a boat.

It is another object of the present invention to provide a technique for preventing damaging pin plating during handling.

According to the invention, sleeves (bushings) are provided in selected pin-receiving holes in the platform portion of a boat transport. Preferably, the sleeves are ceramic bushings.

The bushings fit into holes in the platform portion of a boat transport and accomplish various purposes, namely:

The bushings extend above the top surface of the boat, thereby elevating the package body above the boat;

The bushings have a bore only slightly greater than a pin diameter, thereby (1) precisely locating the package on the boat, (2) minimizing lateral movement of the package on the boat, and (3) preventing scraping of pin plating by non-bushed (bushingless) holes; and The bushings are formed of a "plating-friendly" material, such as aluminum oxide, thereby preventing scraping of pin plating by the bushing, and in the case of a non-metallic bushing material also preventing galvanic corrosion at the pin/bushing interface.

In an alternate embodiment of the invention (FIG. 5), a ceramic insert sized to encompass the entire package-receiving area is provided, preferably shaped as a square ring with holes for receiving package pins. A large opening in the platform of the boat receives and retains the insert.

Other objects, features and advantages of the invention will become apparent in light of the following description thereof.

BRIEF DESCRIPTION OF THE DRAWINGS

FIG. 2 is a partial perspective view of a boat transport 200, according to the present invention.

FIG. 3 is a cross-sectional view detailing the bushing of the present invention, taken on a line 3—3 through FIG. 2.

FIG. 4 is a cross-sectional view detailing an alternate embodiment of the bushing of FIG. 3.

DETAILED DESCRIPTION OF THE INVENTION

Figure 1:
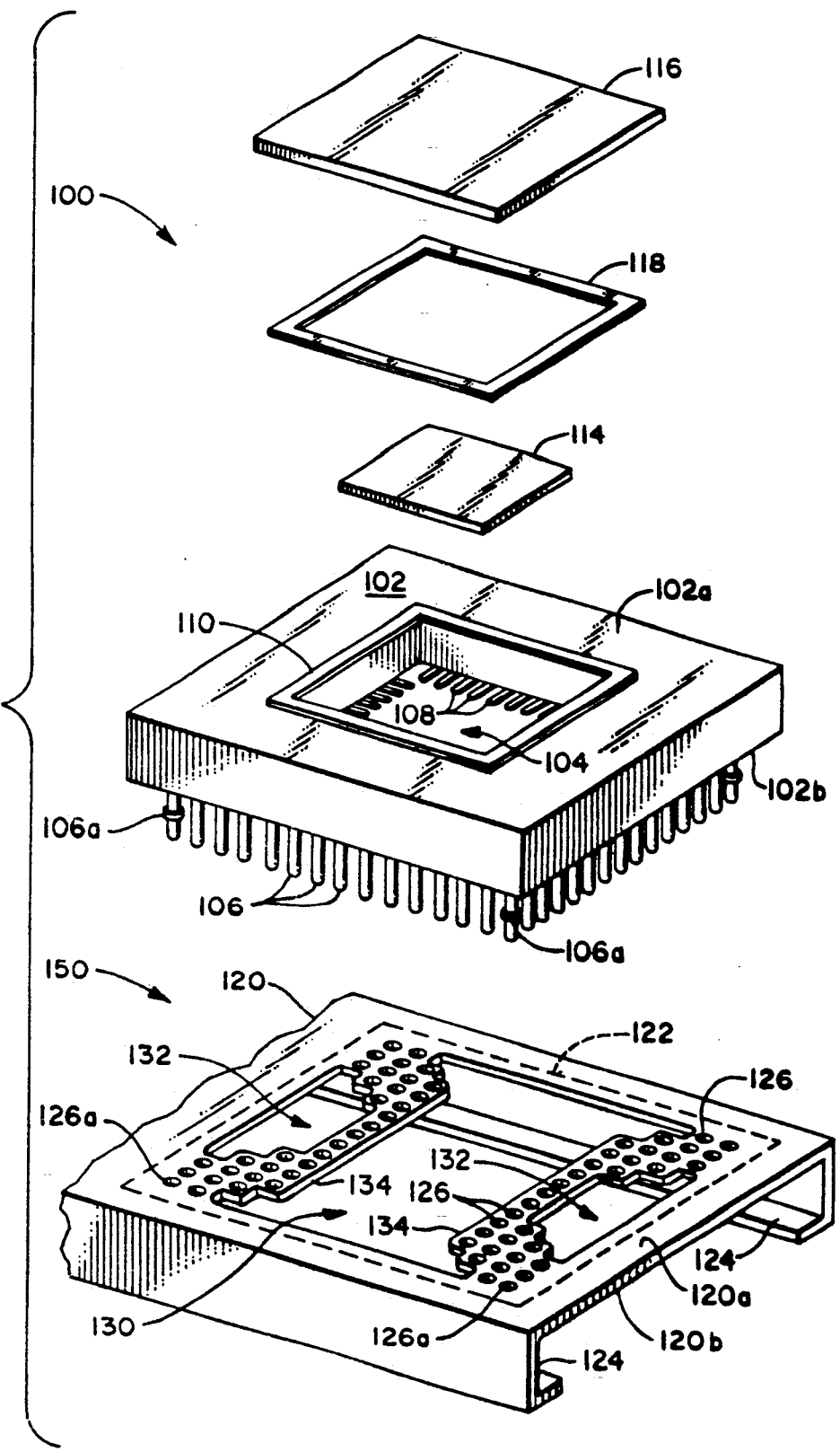
FIG. 1 is an exploded perspective view of a semiconductor device assembly 100 and boat transport 150 of the prior art, and is discussed hereinabove.

FIG. 1 shows a semiconductor device assembly 100 and a boat 120, and has been discussed above. The present invention relates primarily to modifying the boat structure to prevent damaging the leads 106 of the semiconductor device assembly.

FIG. 2 shows a boat transport 200, according to the present invention, and corresponds roughly to the boat 150 of FIG. 1 in that only a portion of a boat sufficient o transport one semiconductor device assembly 100 is shown. As noted above, a boat typically transports about six semiconductor assemblies 100.

As is the case with prior art boat transports, the boat transport 200 is formed of sheet metal on the order of 0.030 to 0.040 inches stainless steel, has a platform portion 202, a top surface 202a, a bottom surface 202b, and side portions 204 extending downward from opposite side edges of the platform portion 202.

Again, as with prior art boat transports, the platform portion 202 of the boat transport 200 has an area 206 for receiving a semiconductor device assembly (100, FIG. This area 206 corresponds roughly in size and shape (usually square) to the plan dimensions of the semiconductor device assembly 100. Cutout 208 is provided through the platform portion 202 in a central region of the assembly-supporting area 206, providing access for automated machinery to lift the semiconductor device assembly off of the boat.

Again, as with the prior art, additional cutouts 210 may be provided through the platform portion 202 within the area 206, leaving bridges 212 preferably at opposite edges of the area 206, and the bridges are provided with holes 214 for receiving some (not all, but a sufficient quantity) of the pins 106 of the semiconductor device assembly 100.

According to the invention, at least one, preferably two to four, of the pin-receiving holes 214 is provided with a bushing 220 extending through the platform portion 202 and extending above the platform portion 202. Preferably, the bushings are formed of a material that is smoother and harder than and galvanically compatible with the pin plating. Preferably, the bushings are formed of a ceramic material, such as aluminum oxide. Preferably, one bushing 220 is provided in a selected hole 214a ("guide hole") at each of the four corners of the area 206. Preferably, the selected holes 214a are not aligned with corresponding guide pins (pins having stops 106a) a semiconductor device assembly 100, since it is desired that the bushings directly support the package body. The bushings being smoother and harder than the pins will avoid bushing wear, pin gouging, and will accurately locate the package vis-a-vis the platform.

In one embodiment, shown in FIG. 3, the bushings 220 have a generally cylindrical body portion 222, and fit through the holes 214. Evidently, the holes 214a selected to have bushings may be enlarged from the remainder of the holes 214. The bushing 220 is inserted into the hole 214a from either surface (202a, 202b) of the platform portion 202, and is secured within the hole 214a with a suitable (high temperature) adhesive 224, such as epoxy. Alternatively, the bushing may be press-fit into the platform.

In another embodiment, shown in FIG. 4, the bushings 220' have a generally cylindrical body portion 222' and a lip 226 disposed about an end of the body portion. The body portion 222' fits through the hole 214a, and the lip 226 is larger than the hole 214a. The bushing 220' is inserted into the hole 214a from the top surface 202a of the platform portion 202, and is secured to the platform portion 202 with a suitable adhesive 224 between the lip 226 and the top surface 202a of the platform portion 202.

Returning to FIG. 3, it can be seen that the bushing 220 has a cylindrical outer dimension for the body portion 222. This outer dimension is sized for easy insertion of the bushing 220 into the hole 214a, such as 0.0002 inches less than the diameter of the hole 214a. The bushing 220 has an axial bore 228 extending completely through the body portion 222, and the axial bore 228 has a diameter slightly (e.g., 0.0002–0.0005 inches) greater than the diameter of a pin 106. At least one, preferably both ends of the body portion 222 are chamfered, from the outer dimension into the bore, so that a pin 106 will be guided and insert easily into the bore 228. In other words, the bushing end facing the package body is concave. The concave bushing end not only allows the pin to be easily inserted into the bushing bore, but also provides a cavity for receiving the braze 106b. Evidently, the support area afforded by the outer dimension of the bushing contacting the package body is greater and more stable than the support area otherwise resulting from the braze 106b contacting the platform 120a.

In marked contrast to the prior art, in which ample clearance is provided between a pin-receiving hole 126 and a pin 106, in the present invention the bushing (220, 220') minimizes this clearance and subsequent mobility of the package 100 vis-a-vis the boat 200. With a single bushing 220 at each of the four corners of the area 206, the semiconductor device assembly 100 is maintained virtually motionless with respect to the boat transport 200. By chamfering both ends of the bushing 220, the bushing can be inserted in any of two possible orientations into the platform portion 202, since it is symmetrical in either of its axial (end-for-end) orientations.

In marked contrast to the prior art, in which the package body 102 can contact the top surface (120a, FIG. 1) of the boat, in the present invention the bushing 220 extends above the top surface 202a of the boat 200, and supports the package body 102 above the top surface of the boat. Although not preferred, the bushings may align with the selected guide pins having stops 106a. The former is preferred, and is illustrated in FIG. 3 (pin 106 without a stop 106a shown prior to entering the bushing 220). In either case, the package body 102 is elevated above the top surface 202a the boat 200, and is supported by the ceramic material of the bushing 220, rather than contacting the metallic material of the boat 200.

In marked contrast to the prior art, in which plating may be scraped off of the pins 106 by the edges of the holes 126, in the present invention the bushings 220 are formed of ceramic material which is "friendly" (e.g., smoother and not galvanically incompatible) to the plating. Since the guide pins (in this case, whichever pins 106 line up with the bushed holes 214a) are precisely guided into the platform portion 202 by the bushings 220, and since there is ample clearance between the remaining (non-guide) pins 106 and the remaining (non-bushed) holes 214, the remaining (non-guide) pins 106 will not be contacted or scraped by the remaining (non-bushed) holes 214, thereby alleviating gouging and/or galvanic corrosion.

The embodiment of FIG. 3 has been constructed and tested, and has been observed to provide superior results. With pins (106) having a diameter of 0.018 inch, ceramic bushings having an outside diameter of $0.030^{+0}$ inches and a bore measuring 0.020 inches were mounted in holes measuring $0.030^{-0}$ inches so that the bushing extended 0.020 inches above the top surface (202a) of the boat. This provided excellent, repeatable results, without damage to either the gold-plated pins or the ceramic package body.

In the prototype, ceramic beads, commonly referred to as "fishspine" were employed. These beads are concave at one end and convex at the other end. They were installed with the concave side up, supporting the package body.

Returning to FIG. 4, showing an alternate embodiment of the bushing 220', it can be seen that the body portion 222' has a cylindrical outer diameter. This outer diameter is sized for easy insertion of the bushing 220' into the hole 214a, and is comparable to the outer diameter of the bushing 220. A lip 226 is integrally formed at one end of the bushing 220', and has a height h approximately 0.015 inches and a diameter d sufficiently (e.g., ten thousandths) larger than the diameter of the hole 214a to prevent the bushing 220' from sliding completely through the hole 214a. In other words, the lip 226 acts as a stop limiting insertion of the bushing 220' into the hole 214a, and also acts as a spacer defining the elevation of the package body above the top surface 202a of the platform portion 202 of the boat 200.

As with the bushing 220, the bushing 220' has a bore 228' slightly larger than the diameter of a pin 106. Since the bushing 220' can only be inserted one way, from the top surface 202a into the hole 214a, it is only necessary to chamfer one end of the bushing, i.e., the lip end into which a pin 106a will be inserted.

As with the bushing 220, the bushing 220' virtually eliminates movement of the package on the platform, and protects the pins from scraping and corrosion, as well as protecting the package body from problems arising from contact with the boat metal.

Figure 5:
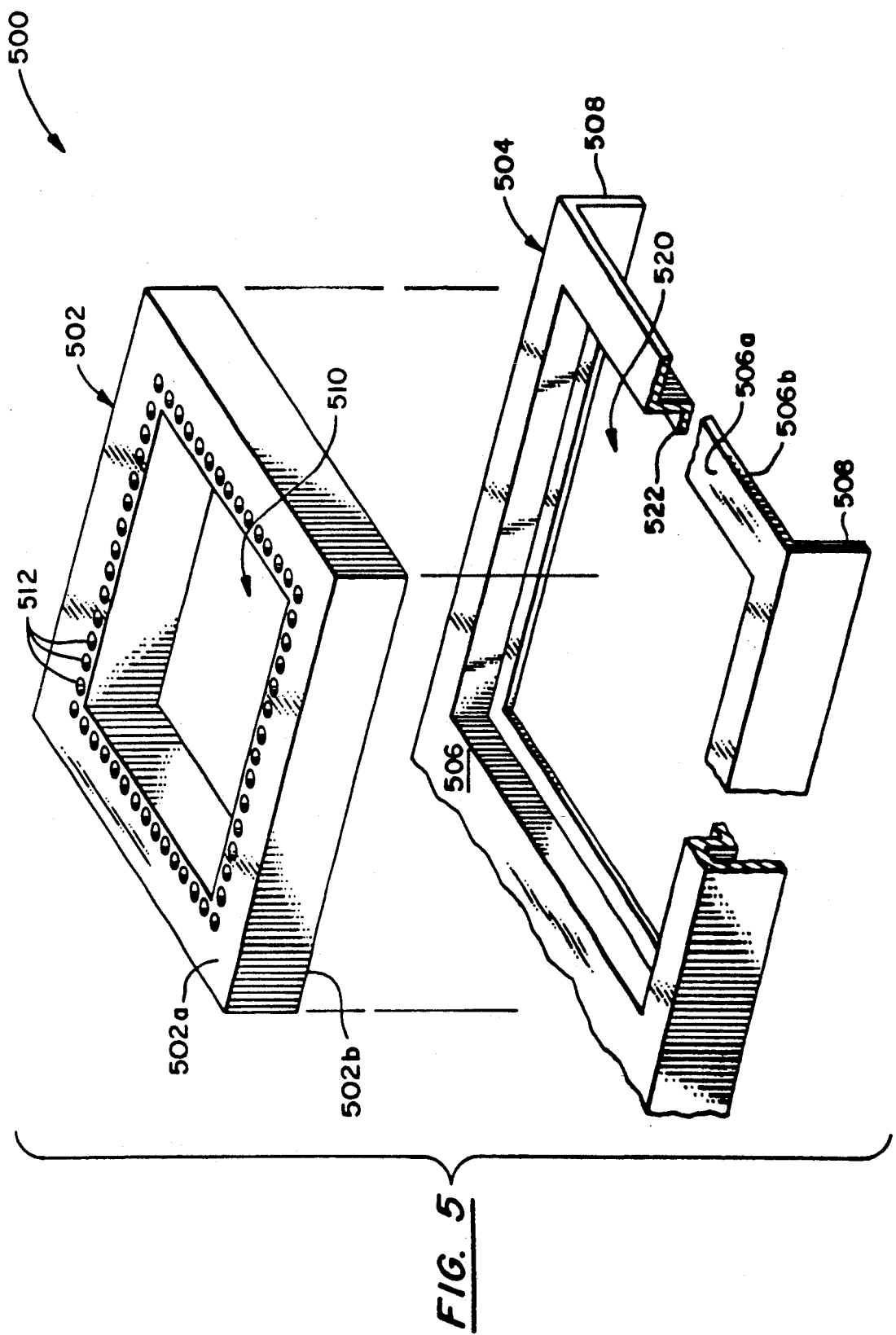
FIG. 5 is a partial perspective view, partially cutaway, of an alternate embodiment 500 of the boat transport of the present invention.

FIG. 5 shows an alternate embodiment 500 of the invention, using a ceramic insert 502 for supporting the package body 102, father than bushings (220, 220').

A boat 504 is provided, having a planar platform portion 506, a top surface 506a, a bottom surface 506b, and side portions 508 extending downward from opposite side edges of the platform portion 506. To this extent, the boat 504 is similar to the previously-described boats 150 (FIG. 1) and 200 (FIG. 2).

The ceramic insert 502 is shaped as a square ring, having a top surface 502a, a bottom surface 502b and a central opening 510 extending through the ring from the top surface to the bottom surface. The outer dimension of the insert encompasses an area sufficient to support a package body (102). A plurality of holes 512 extend completely through the material of the ring.

The boat 504 has a large opening 520 extending through the platform portion 506, which is sized to receive the ring 502 as an "insert". To this end, the opening 520 is provided with a lip 522 extending sufficiently around the periphery of the opening 520 and sized to support the outer periphery of the ring 502. The ring 502 is shown with only a single row of holes 512 extending around the ring, to indicate that its outer periphery is hole-free to provide a support area on the ring 502. In practice, several rows of holes 512 could be provided, so long as the central hole 510 accommodates automated machinery for lifting the semiconductor device assembly.

As shown in FIG. 5, the lip 522 extends completely around the inner periphery of the opening 520, and forms a shelf upon which the support ring 502 rests. Alternate arrangements of tabs, or the like, are readily envisioned, and should be apparent to one of ordinary skill in the art to which the present invention pertains.

The embodiment of FIG. 5 is similar to the previous embodiments, in that the pins 106 and package body 12 contact only ceramic.

The FIG. 5 embodiment, using a ceramic insert 502 to support the entire area of the package body, differs from the previous embodiments in that the package body is not elevated above the support surface (in this case, the package essentially rests upon the ring 502, not taking into account any stops 106a).

As with the bushings 220 and 220', the ceramic insert 502 is preferably formed of aluminum oxide.

The hole 520 through the ceramic insert 502 serves two purposes: (1) it allows access for automated machinery, and (2) it alleviates the need for a vast quantity of holes 512 to accommodate a corresponding quantity of pins 106. It is within the scope of this invention that the ceramic insert 502 would be a flat wafer without a large central opening (510).

An advantage of using a modified boat 504 and a separate insert 502 is that the thermal expansion of the insert is inherently nearly equal to that of the package body, thereby alleviating the aforementioned expansion problems associated with prior art boats.

Another advantage of using a separate insert 502 is that various inserts, all having the same outer dimension and fitting within the same boat 504, can be fabricated to accommodate packages of different sizes and pin spacings. And, if so desired, different packages can be transported on a single boat (using different inserts).

What is claimed is:

1. Boat transport for supporting semiconductor device assemblies of the type having a plurality of pins extending from a bottom surface thereof, comprising:

a planar platform having an area for receiving a semiconductor device assembly, and having a top surface;

holes extending through the area for receiving pins of the semiconductor device assembly;

bushings provided in only a selected "bushed" portion of the holes and extending upward above the top surface of the platform; and a bore extending through each bushing for receiving a pin;

wherein a first portion of the pins are received in unbushed holes, and a second portion of the pins are received in holes having bushings.

2. Boat transport according to claim 1, wherein: the bushings are formed of a ceramic material.

3. Boat transport according to claim 1, wherein: the pins have a diameter; and the bore has a diameter from 0.002-0.005 inches larger than the diameter of a pin.

4. Boat transport according to claim 1, wherein: at least one end of the bushing is chamfered to facilitate insertion of a pin through the bore.

5. Boat transport according to claim 1, wherein: the bushing is cylindrical.

6. Boat transport according to claim 5, wherein: the bushing has two ends; and both ends of the bushing are chamfered.

7. Boat transport according to claim 1, wherein: the bushing has a cylindrical body portion and two ends; further comprising:

a lip formed about one end of the bushing.

8. Boat transport according to claim 1, wherein: the pins extend from a bottom of a package body of the semiconductor device assembly;

a selected portion of the pins are guide pins having expanded "stops" spaced from the bottom of the package body 102, the remaining pins being non-guide pins having a uniform diameter; and the bushings are provided to receive only a portion of the non-guide pins.

9. Boat transport according to claim 1, wherein: the bushings are formed entirely of a material which is smoother and harder than the pins.

10. Boat transport according to claim 1, wherein: the bushings are formed of a material which is galvanically compatible with a plating on the pins.

11. Boat transport according to claim 2, wherein: the ceramic material is aluminum oxide.

12. Boat transport for supporting semiconductor device assemblies of the type having pins extending from a bottom surface thereof, comprising:

a ceramic insert encompassing an area corresponding to the area of a semiconductor device assembly package body;

holes extending through the ceramic insert for receiving pins of the semiconductor device assembly;

a platform planar support surface, and having an opening extending through the support surface; and means for supporting the ceramic insert in the opening.

* * * * *